(12) United States Patent
Chua

(10) Patent No.: US 7,214,628 B2
(45) Date of Patent: May 8, 2007

(54) PLASMA GATE OXIDATION PROCESS USING PULSED RF SOURCE POWER

(75) Inventor: Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 125 days.

(21) Appl. No.: 11/050,472

(22) Filed: Feb. 2, 2005

(65) Prior Publication Data

US 2006/0172551 A1 Aug. 3, 2006

(51) Int. Cl.
*H01L 21/31* (2006.01)
*H01L 21/469* (2006.01)

(52) U.S. Cl. .............................. 438/770; 257/E21.268; 257/E21.293; 257/E21.008

(58) Field of Classification Search ................. 438/770, 438/696
See application file for complete search history.

(56) References Cited

U.S. PATENT DOCUMENTS

| | | | | |
|---|---|---|---|---|
| 4,500,563 | A | | 2/1985 | Ellenberger et al. .......... 427/38 |
| 5,312,778 | A | * | 5/1994 | Collins et al. ............... 438/732 |
| 5,531,834 | A | | 7/1996 | Ishizuka et al. ......... 118/723.1 |
| 5,827,435 | A | | 10/1998 | Samukawa .................... 216/69 |
| 6,045,877 | A | | 4/2000 | Gleason et al. ............. 427/522 |
| 6,187,682 | B1 | * | 2/2001 | Denning et al. ............ 438/694 |
| 6,346,302 | B2 | | 2/2002 | Kishimoto et al. ......... 427/569 |
| 6,458,714 | B1 | * | 10/2002 | Powell et al. ............... 438/770 |
| 6,689,646 | B1 | * | 2/2004 | Joshi et al. .................. 438/149 |
| 6,770,538 | B2 | | 8/2004 | Li et al. ...................... 438/297 |
| 6,831,021 | B2 | * | 12/2004 | Chua et al. .................. 438/776 |
| 2002/0052111 | A1 | | 5/2002 | Paterson et al. ............ 438/689 |
| 2003/0013314 | A1 | * | 1/2003 | Ying et al. .................. 438/710 |
| 2004/0137243 | A1 | | 7/2004 | Gleason et al. ............. 428/447 |
| 2004/0238490 | A1 | | 12/2004 | Sumiya et al. ................. 216/67 |
| 2005/0161434 | A1 | * | 7/2005 | Sugawara et al. ............. 216/67 |

OTHER PUBLICATIONS

Choksi, A.J., Lal. R., and Chandorkar, A.N., "Growth kinetics of silicon dioxide on silicon in an inductively coupled rf plasma at constant anodization currents", *J. Appl. Phys.*, vol. 72, No. 4, Aug. 15, 1992, pp. 1550-1557.

Nicollian, E.H., and Brews, J.R., "MOS (Metal Oxide Semiconductor) Physics and Technology", New York, John Wiley & Sons, Inc., 1982, pp. 191-193.

Shin-ichiro, et al.; Low-Temperature Fabrication of MOSFET's Utilizing a Microwave-Excited Plasma Oxidation Technique (IEEE Electron Device Letters, vol. EDL-7 (p. 38-40), No. 1, dated Jan. 1986).

* cited by examiner

*Primary Examiner*—Walter Lindsay, Jr.
*Assistant Examiner*—Thu-Huong Dinh
(74) *Attorney, Agent, or Firm*—Law Office of Robert M. Wallace

(57) ABSTRACT

A method of fabricating a gate of a transistor device on a semiconductor substrate, includes the steps of placing the substrate in a vacuum chamber of a plasma reactor and introducing into the chamber a process gas that includes oxygen while maintaining a vacuum pressure in the chamber. An oxide insulating layer on the order of several Angstroms in thickness is formed at the surface of the substrate by generating a plasma in a plasma generation region within the vacuum chamber during successive "on" times, and allowing ion energy of the plasma to decay during successive "off" intervals separating the successive "on" intervals, the "on" and "off" intervals defining a controllable duty cycle. During formation of the oxide insulating layer, the duty cycle is limited so as to limit formation of ion bombardment-induced defects in the insulating layer, while the vacuum pressure is limited so as to limit formation of contamination-induced defects in the insulating layer. A conductive gate electrode is formed over the insulating layer.

19 Claims, 9 Drawing Sheets

PLASMA GATE OXIDATION PROCESS USING PULSED RF SOURCE POWER

BACKGROUND OF THE INVENTION

The present invention concerns the formation of a thin gate oxide beneath a gate electrode overlying a source-drain channel of a field effect transistor. The gate oxide is extremely thin (on the order of only Angstroms in thickness) and must be at least nearly free of defects in its amorphous silicon dioxide structure, such as dangling silicon or oxygen bonds. Such dangling bonds create quasi-mobile charge in the gate oxide, leading to two problems. One problem is that the electric fields associated with such charge perturb carrier motion in the source-drain channel, preventing a smooth current flow. Another problem is that such charge, to the extent it is mobile, may contribute to leakage between the gate electrode and the source-drain channel. Therefore, processes for forming the gate oxide must be free of any tendency to form defects in the gate oxide. Currently, only thermal oxide growth processes meet such criteria.

Thermal processes for forming the gate oxide layer have worked well in fabrication of semiconductor devices of the larger feature sizes used in the past. Such thermal processes tend to form high quality gate oxide layers that are free of defects such as dangling bonds or contaminant particles. Moreover, the gate oxide thickness tends to be uniform across the gate area. Unfortunately, as feature sizes are becoming much smaller and different gate oxides are employed in the next generation of advanced technologies, the high wafer temperatures required in thermal oxidation processes are problematic in that the sharp junction definitions which are now required become diffused at the higher temperatures (e.g., above 700° C.). Such a distortion of junction definitions and other features can lead to device failure.

One possible solution to this problem is to employ low temperature plasma processing to form the gate oxide layer. In attempting to do this, other problems have been encountered that render plasma processing apparently useless for gate oxide formation. First, at high chamber pressure (e.g., 100 mT), contaminants tend to accumulate in the gate oxide layer during formation, leading to fatal defects in the gate oxide structure such as dangling bonds or mobile charge. In order to reduce such defects, the chamber pressure can be reduce (e.g., down to tens of mT) by increasing the evacuation rate. While this approach can reduce contamination, it suffers from a tendency to increase plasma ion energy so that the gate oxide layer suffers ion bombardment damage, creating the same type of defects that were sought to be avoided, including dangling bonds and mobile charge. Also, the gate oxide thickness is non-uniform. Thus, it would seem that plasma processing is not feasible, and there has appeared to be no way in which a high quality gate oxide could be formed without raising the wafer temperature beyond allowable limits for the latest generation of devices.

Accordingly, what is needed is a low temperature process for forming a very high quality (defect-free) thin gate oxide layer of uniform thickness.

SUMMARY OF THE INVENTION

A method of fabricating a gate of a transistor device on a semiconductor substrate, includes the steps of placing the substrate in a vacuum chamber of a plasma reactor and introducing into the chamber a process gas that includes oxygen while maintaining a vacuum pressure in the chamber. An oxide insulating layer on the order of several Angstroms in thickness is formed at the surface of the substrate by generating a plasma in a plasma generation region within the vacuum chamber separated from the substrate by a distance L. The plasma is pulsed whereby during successive "on" times the plasma intensity reaches its maximum. The ion energy of the plasma decays during successive "off" intervals that separate the successive "on" intervals, the "on" and "off" intervals defining a controllable duty cycle. The frequency of the "on" and "off" intervals is such that the plasma itself is never fully extinguished. During formation of the oxide insulating layer, the duty cycle is limited so as to limit formation of ion bombardment-induced defects in the insulating layer, while the vacuum pressure is limited so as to limit formation of contamination-induced defects in the insulating layer. The duty cycle is sufficiently reduced to obtain a low defect density in the oxide layer comparable to that of a high quality thermal oxide, less than $10^{11}$ $cm^{-2}.eV^{-1}$ or less than $5 \times 10^{10}$ $cm^{-2}.eV^{-1}$. A conductive gate electrode is formed over the insulating layer.

DETAILED DESCRIPTION OF THE INVENTION

Figure 1:
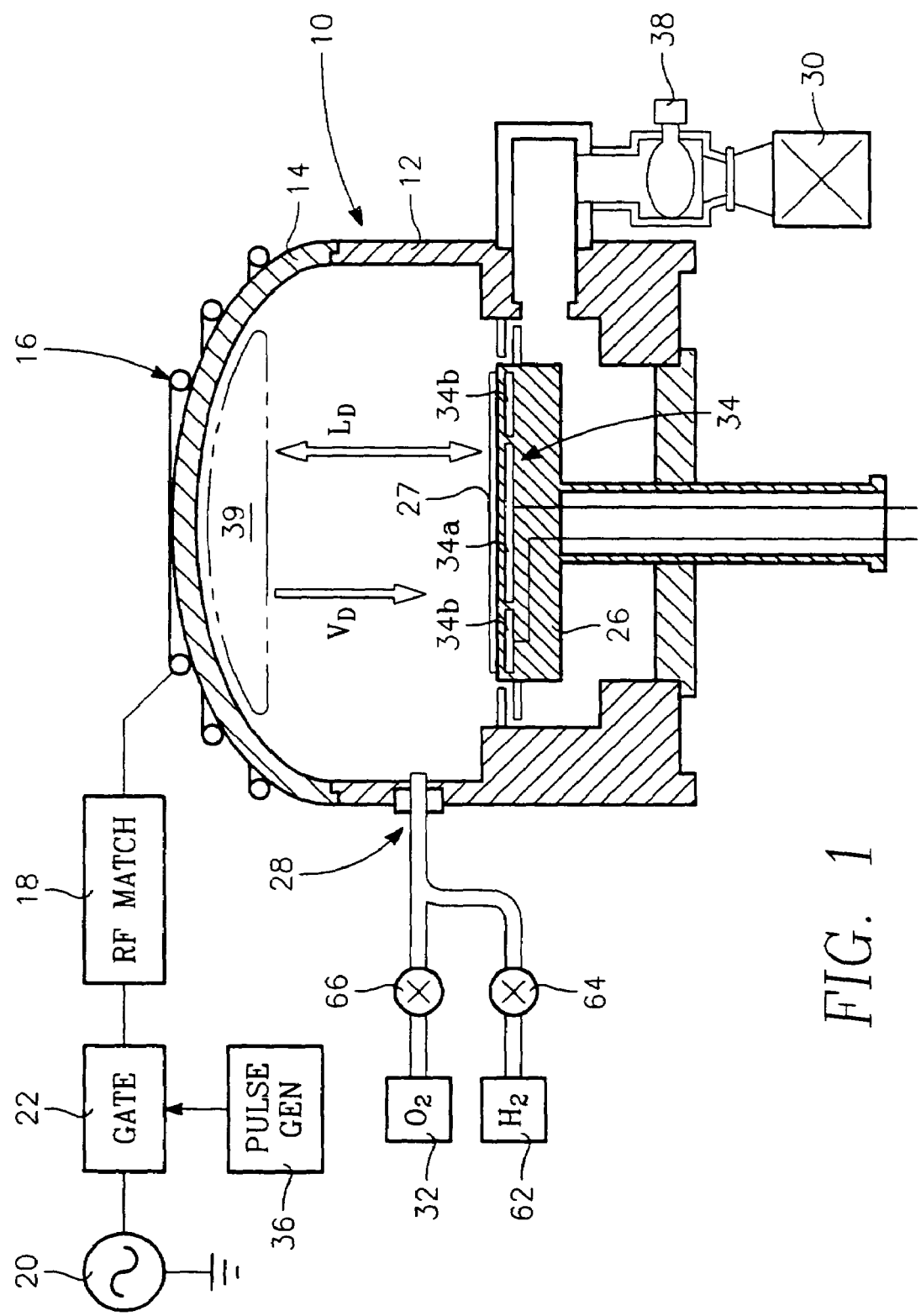
FIG. 1 illustrates a plasma reactor employed in carrying out the invention.

FIG. 1 illustrates a plasma reactor for carrying out the gate oxide formation process of the present invention. The reactor has an inductively coupled plasma source power applicator driven by a pulsed RF power generator. The reactor includes a chamber 10 having a cylindrical side wall 12 and a ceiling 14 which may be either dome-shaped (as shown in the drawing) or flat. The plasma source power applicator consists of a coil antenna 16 over the ceiling 14 coupled through an impedance match network 18 to an RF power source consisting of an RF power generator 20 and a gate 22 at the output of the generator 20 controlled by a pulse signal having a selected duty cycle. The reactor further includes a wafer support pedestal 26, which may be an electrostatic chuck, for holding a semiconductor wafer 27, a gas injection system 28 and a vacuum pump 30 coupled to the interior of the chamber. The gas injection system 28 is supplied by a process gas source, such as an oxygen container 32. The wafer support pedestal 26 includes heating apparatus such as a dual radial zone heater 34 having radially inner and outer heating elements 34a, 34b beneath the top surface of the wafer support pedestal. The chamber pressure is controlled by a throttle valve 38 of the vacuum pump 30. The duty cycle of the pulsed RF power output at the gate 22 is controlled by controlling the duty cycle of a pulse generator 36 whose output is coupled to the gate 22. Plasma is generated in an ion generation region 39 corresponding to a volume under the ceiling 14 surrounded by the coil antenna 16.

Figure 2A:
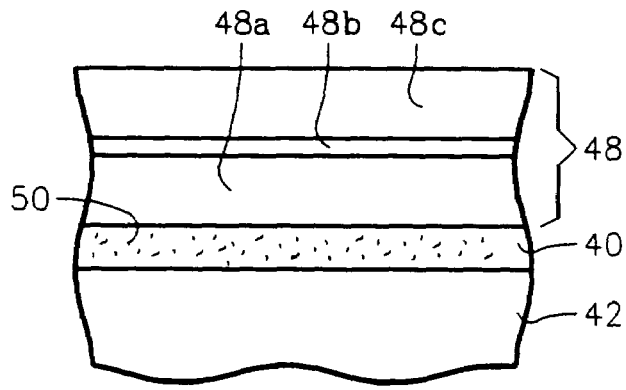
FIGS. 2A through 2D illustrate sequential changes in a semiconductor structure during a process of the invention.

FIG. 2A depicts a semiconductor device including a thin insulating gate oxide layer 40 formed over a semiconductor substrate 42 corresponding to the wafer 27 of FIG. 1. A gate electrode 48 overlies the gate oxide layer 40. The semiconductor substrate 42 may be silicon and the insulating gate oxide layer 40 may be silicon dioxide. The electrode 48 may be the gate of a transistor that includes source and drain regions formed later in the substrate 42 during a subsequent fabrication step. As is well known, charge carriers (electrons or holes) flow beneath the gate 48 and between the source and drain. If the silicon dioxide structure in the gate oxide layer 40 has defects 50 giving rise to incomplete or dangling bonds, then the electric fields associated with those dangling bonds can perturb the flow of charge carriers, thereby impeding device performance. This deleterious effect is noticeable at a defect density (Dit) in the gate oxide layer greater than $5\times10^{10}$ cm$^{-2}$.eV$^{-1}$, where a single defect corresponds to a dangling bond or interface trap quantum states. The defect density Dit is defined relative to an energy level (eV) because individual trap levels (defects) cannot be distinguished experimentally and the summation over all interface trap levels can be replaced by an integral. The density function Dit(s) is defined as the probability per unit area that an interface trap level is present with energy (in eV) between an energy s and an energy s+delta s. This definition is discussed by E. H. Nicollian and J. R. Brews, *MOS (Metal Oxide Semiconductor) Physics and Technology*, John Wiley and Sons, 1982, at pp. 191–193.

Such defects can arise in a thermal oxide growth process when the formation of the gate oxide layer 40 is carried out at too low a temperature (e.g., below 800° C.). Such defects can be produced in either a thermal oxide growth process or in a plasma oxide formation process by contaminant particles within the insulating gate oxide layer 40.

The gate electrode 48 may consist entirely of polysilicon. Or, the gate electrode may be a stacked structure as shown in FIG. 2A including a polysilicon base layer 48a, a tungsten nitride diffusion barrier layer 48b and a tungsten layer 48c.

Figure 3:
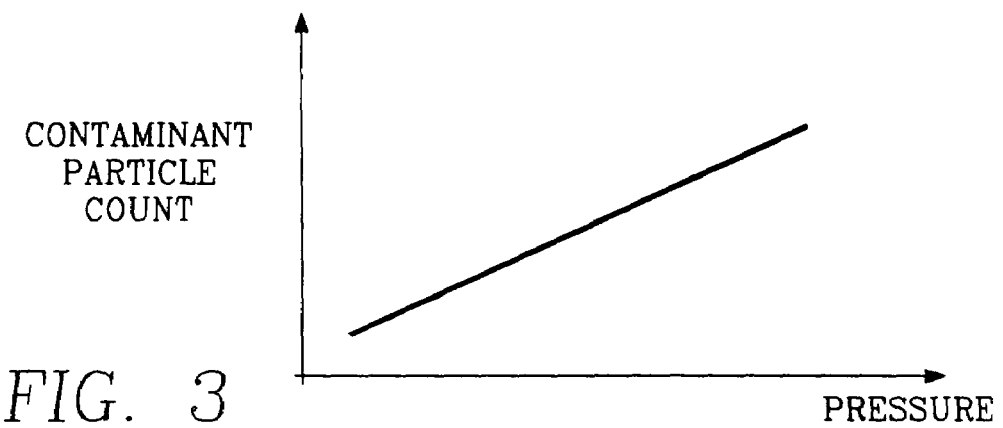
FIG. 3 is a graph qualitatively illustrating the general behavior of contaminant particle count in a gate oxide layer as a function of chamber pressure.
Figure 4:
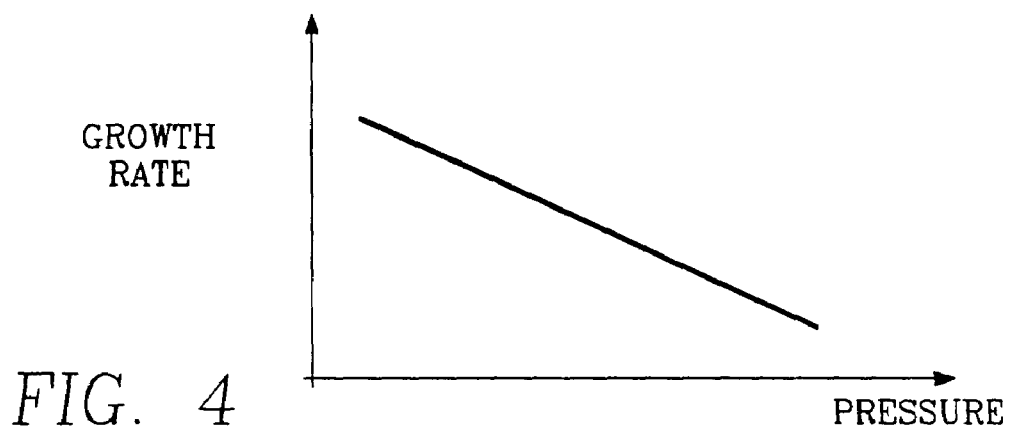
FIG. 4 is a graph qualitatively illustrating the general behavior of growth rate of the gate oxide layer as a function of chamber pressure.

Plasma processing can be used to form the silicon dioxide gate insulator layer 40 at relatively low temperatures (e.g., below 700° C.). Specifically a plasma formed of oxygen gas can cause silicon oxide to grow on exposed portions of the silicon substrate 42 to form the gate insulator layer 40. However, contaminants can enter the plasma and cause defects in the silicon dioxide gate insulator layer 40 if the chamber pressure is too high. One approach to avoid this problem is to reduce the chamber pressure until the contaminant particle count in the plasma is sufficiently low. FIG. 3 is graph illustrating the basis for such an approach, in which contaminant particle count in the plasma decreases as chamber pressure is reduced. Reduction in chamber pressure increases productivity because the oxide growth rate increases as chamber pressure is reduced, as indicated in the graph of FIG. 4. Therefore, it would seem desirable to perform the plasma oxide growth process at a reduced chamber pressure (e.g., on the order of about 10 mT) in order to eliminate contaminant-induced defects in the gate insulator layer 40 and to enhance productivity.

Figure 5:
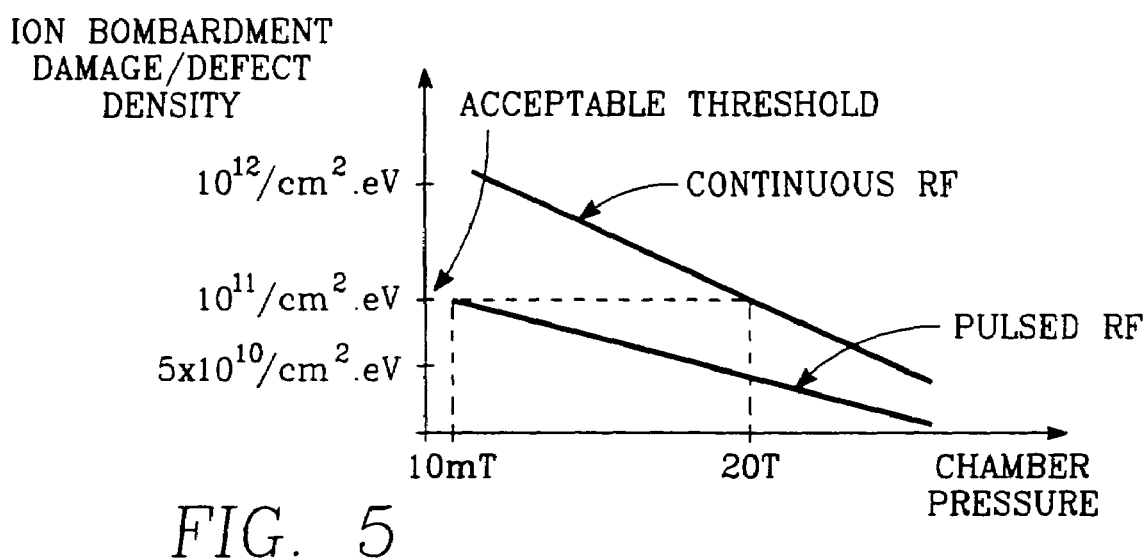
FIG. 5 is a graph comparing the ion bombardment damage count or density in the gate oxide layer as a function of chamber pressure for the case in which plasma source power is a applied as continuous RF power (the curve labeled "CW") and as pulsed RF power (the curve labeled "pulsed RF").

However, a new problem arises upon such a reduction of the chamber pressure, namely an increase in ion bombardment damage in the silicon dioxide gate insulator layer 40 as pressure is decreased. This trend is illustrated qualitatively by the curve labeled "Continuous RF" in the graph of FIG. 5, showing an increase in ion bombardment-induced defects in the gate insulator layer 40 as chamber pressure is reduced. Such ion-bombardment defects increase so quickly as pressure is reduced while contaminant-induced defects increase so quickly as chamber pressure is increased, that there is no range of chamber pressure values at which the process is free of unacceptably high counts of defects. The defects are attributable to either contamination at higher pressures or ion bombardment damage at lower pressures.

The increase in ion bombardment-induced defects as chamber pressure is reduced is likely due to the decrease in collision frequency within the plasma, so that energetic ions are less likely to lose energy through inelastic collisions prior to impacting the wafer. At lower chamber pressures, the plasma is less dense so that energetic ions will not tend to lose so much of their energy through numerous collisions with other particles (ions, radicals, atoms, etc.) before impacting the wafer. They therefore impact the substrate with higher energy, causing greater damage.

A further problem with plasma processes for growing the silicon dioxide gate insulator layer 40 is that plasma processing typically produces a non-uniform thickness distribution of the gate insulator layer 40, typically having a variance of about 1.04% across the wafer surface.

In the present invention, contamination-induced defects are eliminated by reducing the chamber pressure to very low levels (on the order of 10 mT). At the same time, ion bombardment-induced defects that would be expected at such a low chamber pressure levels are prevented by using a quasi-remote plasma source and pulsing the RF plasma source power (using a pulsed RF power source). I have discovered that reducing the pulsed RF plasma source duty cycle reduces the density of defects believed to be formed by ion bombardment damage in the silicon dioxide layer. In addition to reducing defect density, pulsing the plasma source power provides a surprisingly uniform distribution of thickness of the gate insulator layer 40, which solves the problem of non-uniform oxide formation in the plasma process.

The qualitative improvement or reduction in the ion bombardment damage defects in the gate oxide layer 40 using pulsed RF plasma source power is illustrated in the curve labeled "pulsed RF" in the graph of FIG. 5, showing that the defect density remains below an acceptable threshold level (e.g., below about $5 \times 10^{10}$ cm$^{-2}$.eV$^{-1}$) down to a chamber pressure of about 10 mT.

It is believed the improved uniformity of the gate insulator layer 40 realized using a pulsed RF plasma source is attributable to the attenuation of electrical field gradients that tend to build up during the "on" time of the RF source power, the "off" time of the duty cycle being sufficient for these fields to die or relax so that they cannot reach sufficient levels to induce non-uniform growth rates across the wafer.

Figure 6:
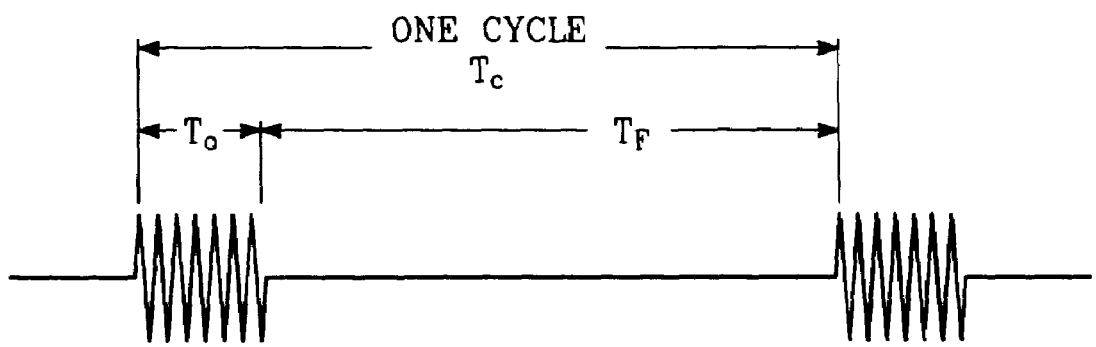
FIG. 6 illustrates the time domain waveform of the pulsed RF plasma source power employed in carrying out the invention.
Figure 7:
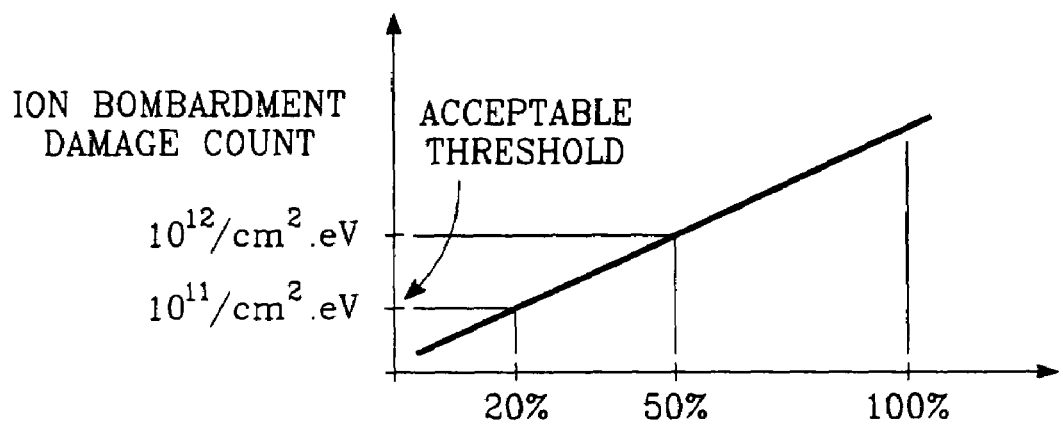
FIG. 7 is a graph qualitatively illustrating the general behavior of ion bombardment damage count or density in the gate oxide layer as a function of duty cycle of the pulsed RF plasma source power.
Figure 8:
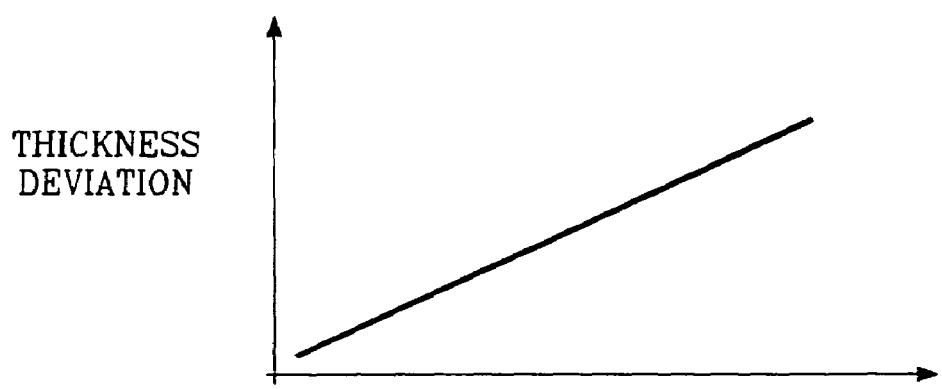
FIG. 8 is a graph qualitatively illustrating the general behavior of thickness deviation across the gate oxide layer as a function of duty cycle of the pulsed RF plasma source power.

FIG. 6 illustrates the time domain waveform of the output of the gate 22 of FIG. 1, in which each burst of RF power occurs during an on-time interval $T_o$ once each period or cycle $T_c$ of the pulsed RF signal. The duty cycle is defined as $100\% \times T_o \div T_c$. FIG. 7 is a graph indicating that the ion bombardment-induced defect count in the gate insulator layer 40 decreases as the duty cycle decreases. FIG. 8 is a graph showing that the deviation in thickness of the gate insulator layer 40 across the diameter of the layer decreases as the pressure is decreased.

Figure 9:
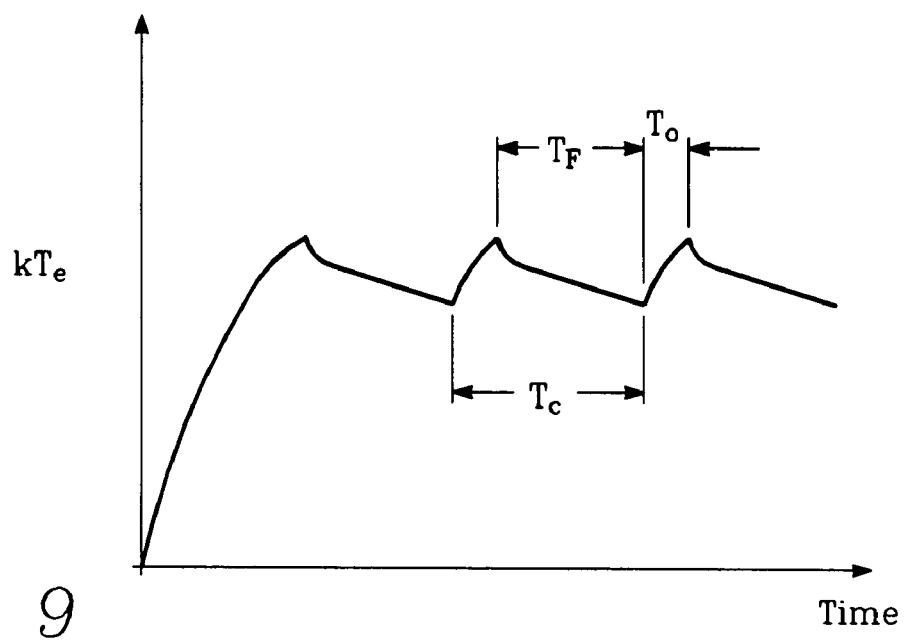
FIG. 9 is a graph of the plasma electron energy as a function of time corresponding to the source power waveform of FIG. 6.
Figure 10:
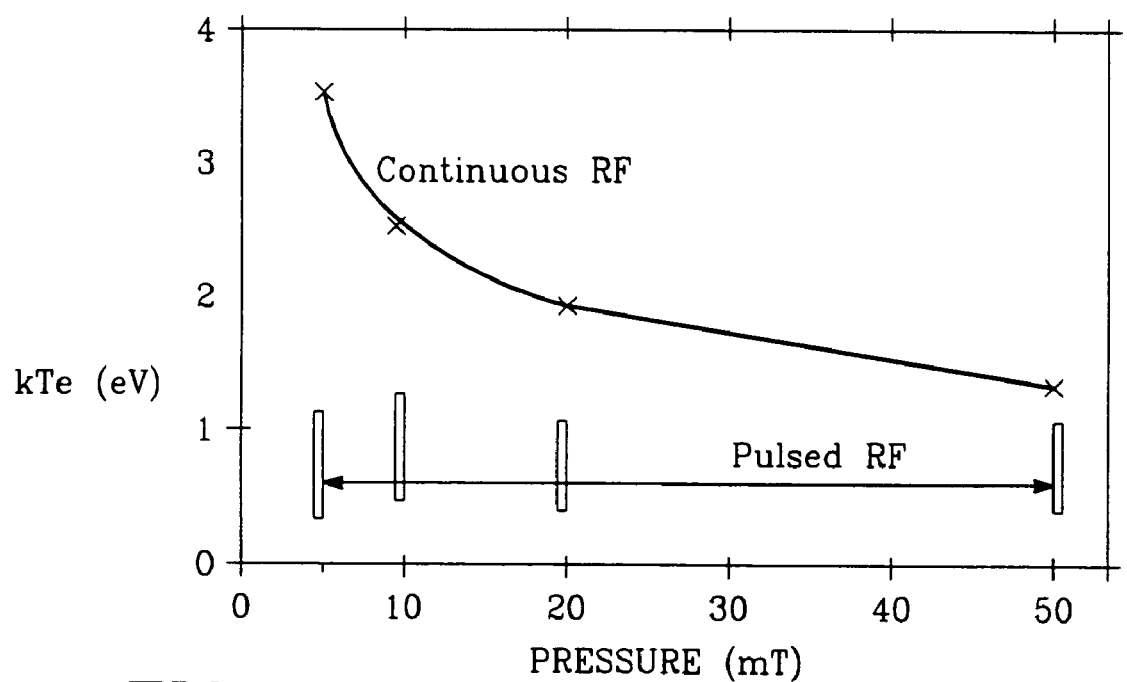
FIG. 10 is a graph of plasma electron energy as a function of chamber pressure for the case of continuous RF source power (the curve labeled "continuous RF") and for the case of pulsed RF plasma source power (the curve labeled "pulsed RF").

The effects of pulsing the RF power applied to the coil antenna 16 of FIG. 1 are illustrated in FIG. 9, showing the plasma energy (as indicated by the electron temperature $T_e$ and Boltzmann's constant k) over time. During the "on" time of the pulsed RF power, the plasma energy increases and during the "off" time it decreases. During each "off" time, the fastest electrons diffuse to the chamber walls, allowing the plasma to cool. During the short "on" time, the plasma is generated in the ion generation region 39 loosely corresponding to the volume enclosed by the coil antenna 16. As indicated in FIG. 1, the ion generation region 39 is elevated a significant distance $L_D$ above the wafer 27. Plasma generated in the ion generation region near the ceiling 14 during the "on" time drifts at an average velocity $V_D$ (FIG. 1) toward the wafer 27 during the "off" time. During the "off" time, the most energetic electrons diffuse to the chamber walls at a much faster velocity than the plasma ion drift velocity $V_D$. Therefore, during the "off" time, the plasma ion energy decreases significantly before the ions reach the wafer 27. During the next "on" time, more plasma is produced in the ion generation region, and the entire cycle repeats itself. As a result, the energy of the plasma ions reaching the wafer 27 is significantly reduced. This is depicted in the graph of FIG. 10, in which the plasma energy at the surface of the wafer 27 is plotted over different reactor chamber pressures for the pulsed RF source power case (the curve labeled "pulsed RF") and for the continuous RF source power case (the curve labeled "continuous RF"). At the lower (more desirable) range of chamber pressure, namely around 10 mT and below, the plasma energy of the pulsed RF case is greatly reduced from that of the continuous RF case. The "off" time $T_F$ of the pulsed RF power waveform of FIG. 6 and the distance $L_D$ between the ion generation region 39 and the wafer 27 must both be sufficient to allow plasma generated in the ion generation region to loose a sufficient amount of its energy so that it causes little or no ion bombardment damage or defects upon reaching the wafer. Specifically, the "off" time $T_F$ is defined by a pulse frequency between about 2 and 20 kHz and an "on" duty cycle between about 5% and 20%. In one implementation, the ion generation region-to-wafer distance $L_D$ is on the order of about 2 cm or 3 cm. The ion generation region-to-wafer distance $L_D$ can be about the same as (or greater than) the distance $V_D \times T_F$ traveled by the plasma ions during a single "off" time of the pulsed RF power waveform.

Figure 11:
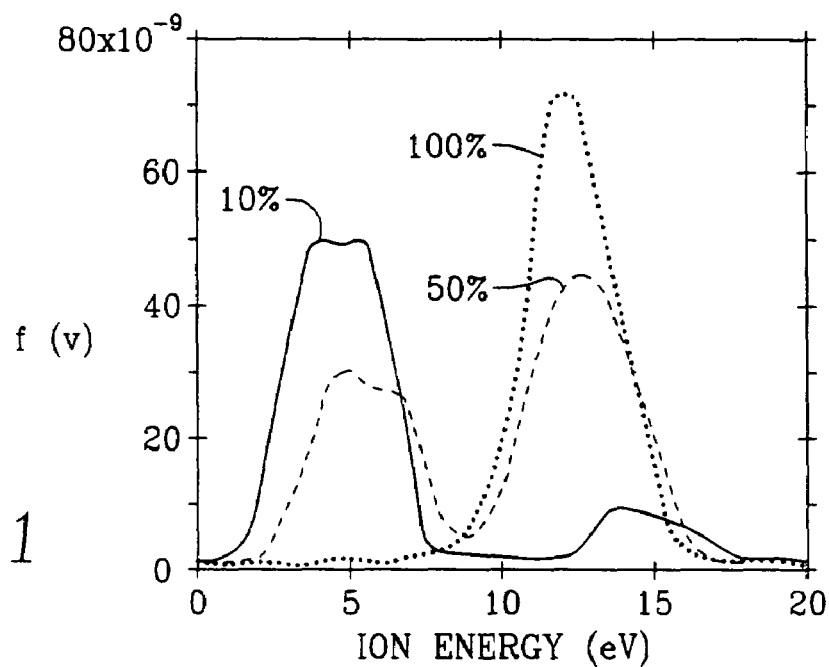
FIG. 11 is a graph illustrating plasma ion energy population distributions (population being the vertical axis and ion energy being the horizontal axis) for three different duty cycles, "10%", "50%" and "100%".

FIG. 11 illustrates an energy distribution of electron population for different duty cycles of the pulsed RF power waveform, namely duty cycles of 100% (dotted line), 50% (dashed line) and 10% (solid line). The 100% duty cycle case corresponds to continuous RF and has a very high energy distribution peaking at about 13 eV. The 10% duty cycle case has a negligible population component at 13 eV, the population concentrating at about 4 eV. At this lower energy level (4 eV), there are few or no defects created in the gate insulator layer 40 by ion bombardment damage.

Figure 12:
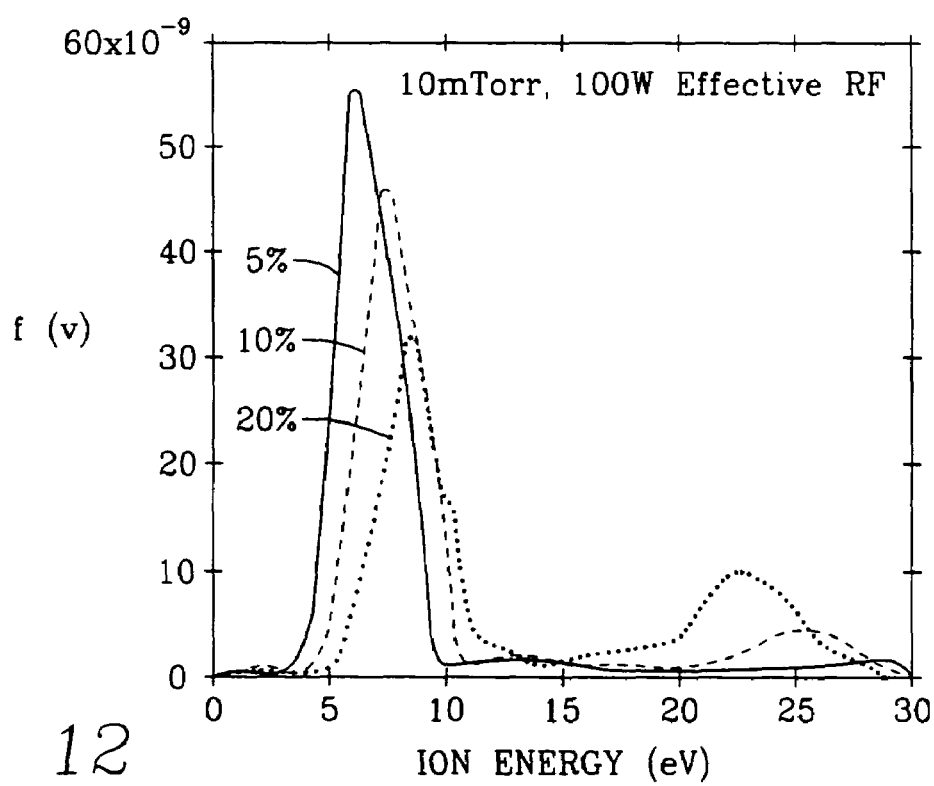
FIG. 12 is a graph illustrating plasma ion energy population distributions (population being the vertical axis and ion energy being the horizontal axis) for three relatively short duty cycles, "5%", "10%" and "20%", showing a much more favorable energy distribution.

FIG. 12 is a graph of ion energy population distribution for different pulsed RF duty cycles at a very low (and therefore desirable) chamber pressure of 10 mT. As the duty cycle decreases from 20% (dotted line) to 10% (dashed line) and finally to 5% (solid line), the peak energy falls from about 9 eV to 7 eV and finally to 5 eV. The 5 eV energy level is one at which there are few or no defects created in the gate insulator layer 40.

Figure 13:
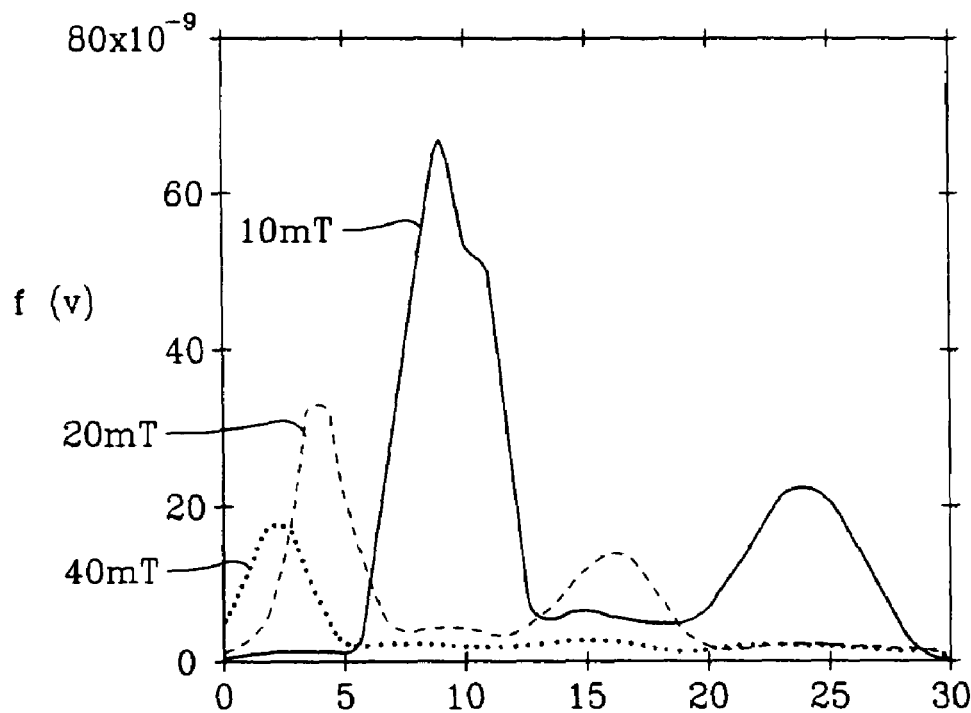
FIG. 13 is a graph illustrating plasma ion energy population distributions (population being the vertical axis and ion energy being the horizontal axis) for three different chamber pressures, "10 mT" (solid line), "20 mT" (dashed line) and "40 mT" (dotted line).
Figure 14:
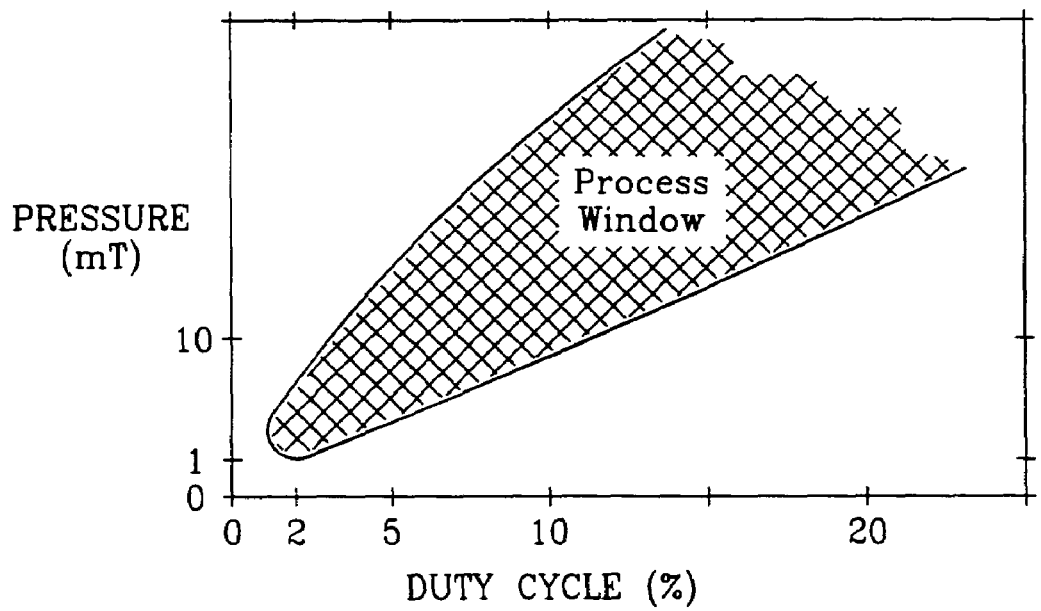
FIG. 14 is a graph depicting a process window of chamber pressure (vertical axis) and duty cycle (horizontal axis).

FIG. 13 is a graph illustrating the effect of chamber pressure on the ion energy population distribution at a modest pulsed RF power duty cycle of 20%. As the chamber pressure decreases from 40 mT (dotted line) to 20 mT (dashed line) and finally to 10 mT (solid line), the peak population ion energy increases from about 2 eV, to 5 eV and finally to 10 eV. Comparing the behaviors illustrated in FIGS. 12 and 13, it is seen that as the chamber pressure is decreased to reduce contamination-induced defects in the gate insulator layer, the pulsed RF power duty cycle must be reduced as well to avoid undesired increases in plasma ion energy that might otherwise accompany the pressure decrease. Therefore, an operating window for the process of the invention illustrated in FIG. 14 shows possible pairs of chamber pressure and duty cycle values that produce the highest quality gate insulator layer in an oxidation process. The width of the process window depends upon the permissible defect density in the gate oxide layer that is formed during the process of the invention.

A surprising advantage of the pulsed RF plasma oxidation process is the great improvement in gate insulator thickness uniformity. In the continuous RF source power case, the variance in silicon dioxide thickness across the wafer has been about 1% or greater (when carried out at a high temperature of about 700° C.). Using pulsed RF source power in accordance with the invention, the variance in silicon dioxide thickness is reduced to only 0.16% at the same temperature and to 0.46% a low wafer temperature (30° C.), a dramatic improvement in either case.

Figure 2B:
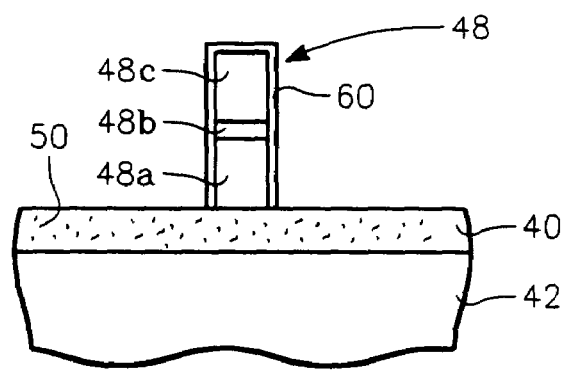
Figure 2C:
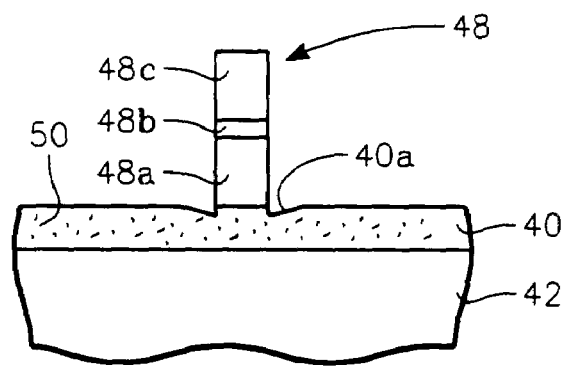
Figure 2D:
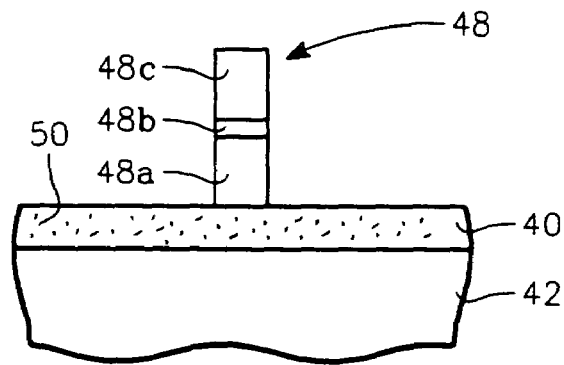

Selective Gate Oxidation Process:

Dynamic random access memories (DRAM's) have a gate structure in which the gate insulator layer 40 of FIG. 2A is silicon dioxide and the gate electrode 48 is a layered structure having a polysilicon base layer 48a, a tungsten nitride diffusion barrier layer 48b and a tungsten layer 48c. One problem with tungsten is that it oxidizes very rapidly. The gate structure 48 of FIG. 2A is photolithographically etched to define a gate having the desired width and length as shown in FIG. 2B. This exposes the side walls of the tungsten layer 48c. The sidewalls of the tungsten gate electrode 48c spontaneously oxidize to form a tungsten oxide film 60 on the electrode sidewalls, as shown in FIG. 2B. The tungsten oxide film 60 must be removed. An oxide etch process is therefore performed to remove the tungsten oxide layer 60. However, this oxide etch process also attacks the silicon dioxide gate insulator layer 40, removing material from the gate insulator layer 40 near the bottom of the gate 48, giving it a slightly concave shape defining a recess 40a, as shown in FIG. 2C. The material missing from the gate insulator layer 40 in FIG. 2C must be replaced in a thermal (high temperature) re-oxidation process that restores the shape of the gate insulator layer 40, as shown in FIG. 2D. The problem in carrying out the re-oxidation process is that it will rapidly re-oxidize the sidewalls of the tungsten layer 48c, unless special measures are taken. These special measures require the use of hydrogen mixed with the oxygen gas used in the thermal re-oxidization process, in a ratio of about 90% Hydrogen and 10% Oxygen. The hydrogen reduces oxide on the tungsten more rapidly than oxide can form on it, but does not do this to the silicon dioxide formed on the gate insulator layer 40. The result is that the silicon dioxide is replaced on the gate insulator 40 without oxidizing the sidewall of the tungsten layer 48c.

The main problem with the foregoing re-oxidation process is that must be performed at high temperatures (e.g., 800° C.) using rapid thermal processing methods, in order to maintain a high quality silicon dioxide structure. Such a high temperature cannot be used in the latest generation of devices because of their extremely small feature size, in particular the channel length or source/drain spacing.

Figure 15:
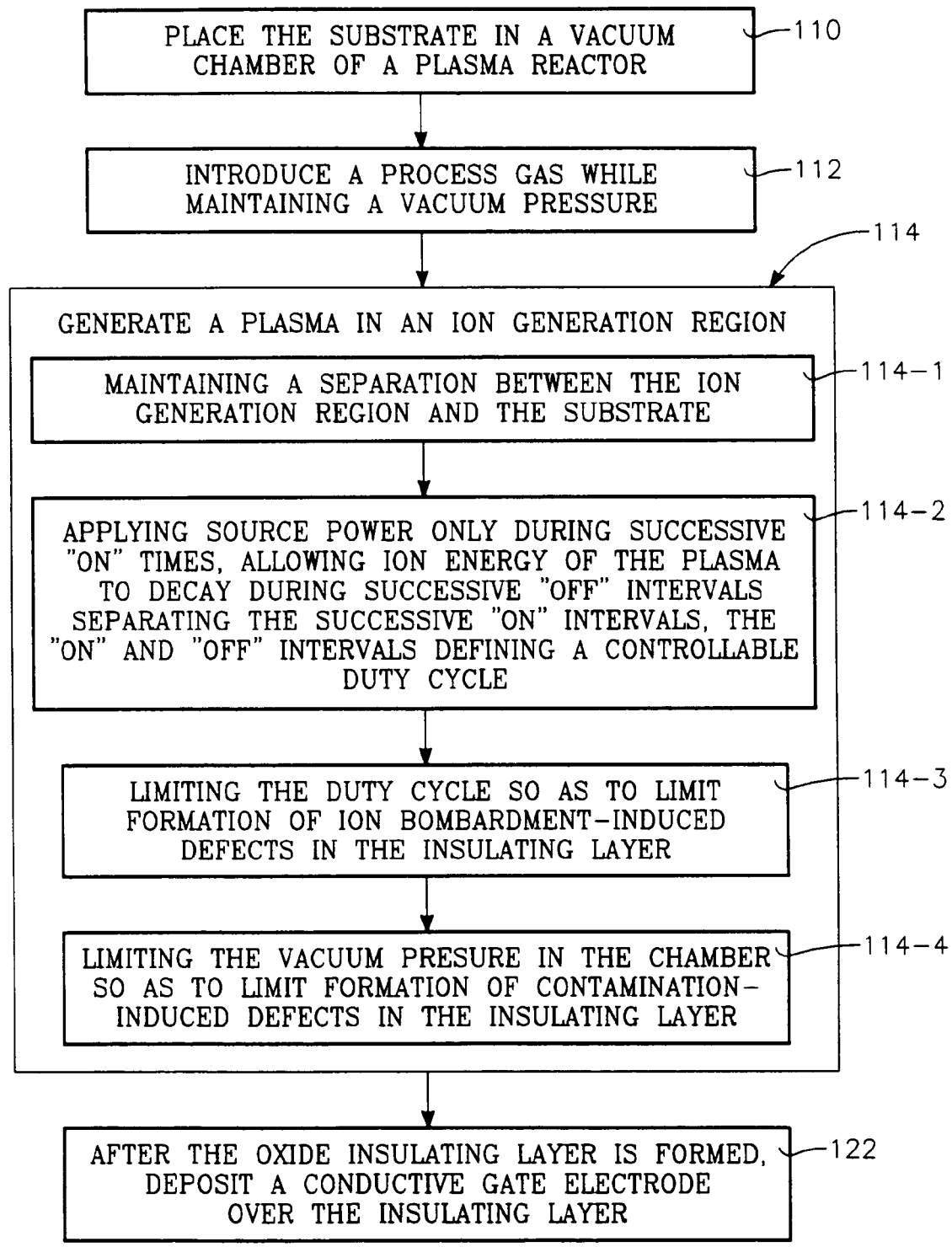
FIG. 15 is a flow diagram depicting a gate oxide formation plasma process of the invention.

A pulsed RF plasma can be employed to carry out the gate insulator selective re-oxidation process to deposit a high quality oxide layer having a very low defect density. As in the embodiments described above the defect density is reduced by reducing the duty cycle of the pulsed RF plasma. The process can be performed at a reduced temperature, a significant advantage. The selective re-oxidation process is carried out by providing a hydrogen gas source 62 in the reactor of FIG. 1, and flow control valves 64, 66 governing the proportion of hydrogen and oxygen that is mixed and supplied to the gas injection system 28. The hydrogen/oxygen ratio used in the reactor of FIG. 1 for the selective re-oxidation process is about 90% hydrogen and 10% oxygen. A process window for pulsed RF duty cycle and chamber pressure similar to that discussed above with reference to FIG. 14 may be employed in carrying out the selective re-oxidation process. This process window ensures the growth of a high quality silicon dioxide film at low temperature and free of defects induced by either contamination or ion bombardment damage. Specifically, the pulsed RF plasma source duty cycle is reduced sufficiently to minimize the oxide defect density below about $5\times10^{10}$ $cm^{-2}.eV^{-1}$ FIG. 15 is a block diagram of a sequence of steps in the oxidation process in accordance with a method of the invention for fabricating a gate electrode on a semiconductor substrate. The first step is to place the substrate in a vacuum chamber of a plasma reactor (block 110 of FIG. 15). The next step is to introduce into the chamber a process gas that includes oxygen while maintaining a vacuum pressure in the chamber (block 112 of FIG. 15). A plasma is generated in an ion generation region in the chamber (block 114) in order to form the insulating gate oxide layer 40. This step includes the following sub-steps:

(a) Maintaining a separation between the ion generation region and the substrate of a distance L (block 114-1 of FIG. 15);

(b) Generating the plasma by applying source power only during successive "on" times, allowing ion energy of said plasma to decay during successive "off" intervals separating the successive "on" intervals, the "on" and "off" intervals defining a controllable duty cycle (block 114-2);

(c) Limiting the duty cycle so as to limit formation of ion bombardment-induced defects in the insulating layer (block 114-3); and (d) Limiting the vacuum pressure in the chamber so as to limit formation of contamination-induced defects in the insulating layer (block 114-4 of FIG. 15).

After the oxide insulating layer is formed, a conductive gate electrode is deposited over the insulating layer (block 122 of FIG. 15).

Figure 16:
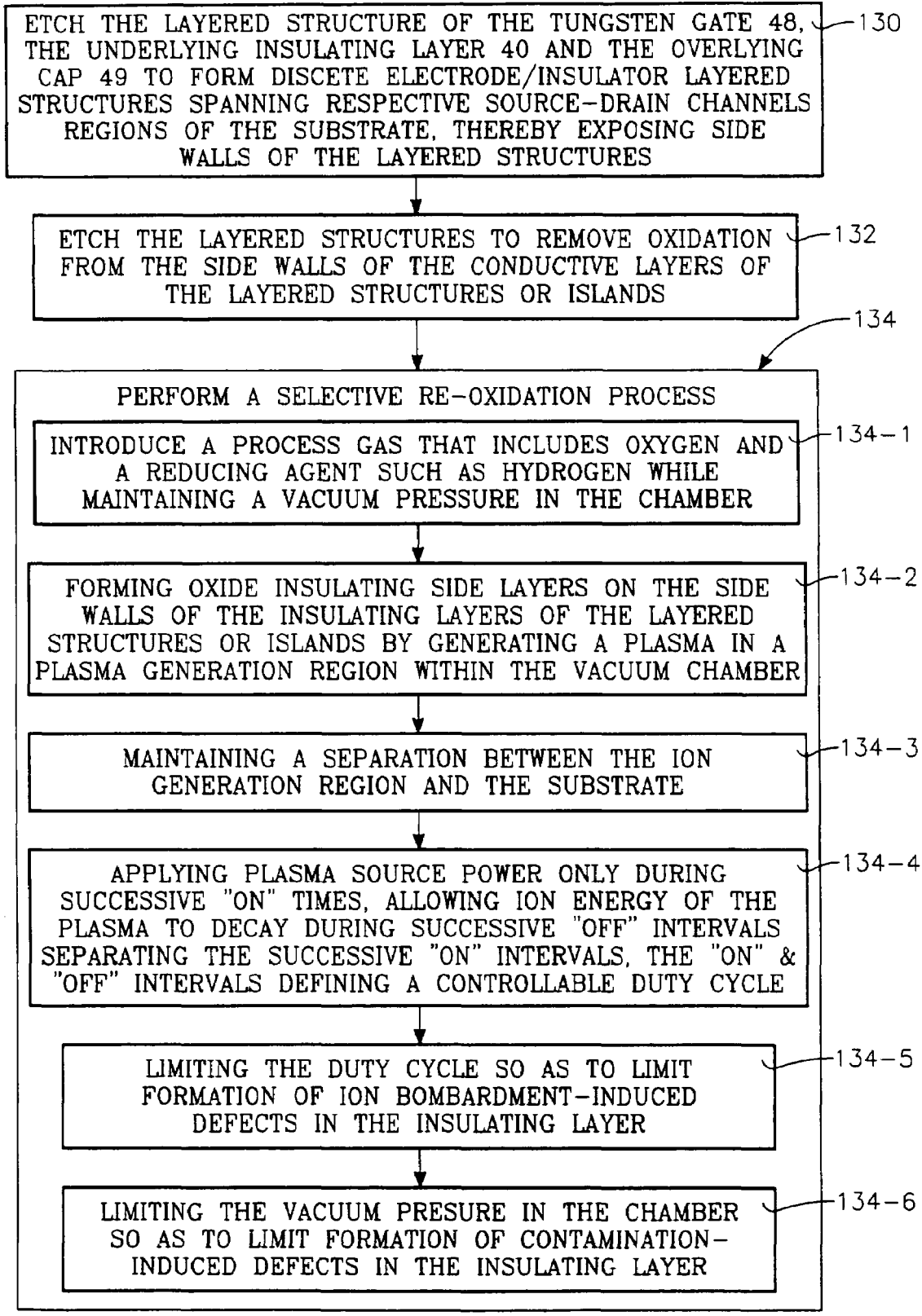
FIG. 16 is a flow diagram depicting a selective oxidation plasma process of the invention.

FIG. 16 illustrates a selected oxidation process carried out in another embodiment of the invention. The selective oxidation process is particularly useful where the gate electrode includes a tungsten layer. The gate oxide layer underlying the tungsten gate may be formed by the process of FIG. 15 described above. The re-oxidation process of FIG. 16 begins with the layered tungsten gate structure of FIG. 2B. Referring to FIG. 16, the layered structure of FIG. 2A is etched to form a gate having the desired length and width, thereby exposing side walls of the layers 48a, 48b, 48c (block 130 of FIG. 16). The exposed sidewalls of the tungsten layer 48c tend to oxidize spontaneously to form a tungsten oxide layer 60 shown in FIG. 2B, and this oxidation must be removed. Therefore, the next step is to etch the layered structure 48 to remove the oxidation layer 60. This etch step tends to remove some of the material from the insulator layer 40 at the bottom of the sidewall of the layered structure 48 (thereby forming recesses 40a illustrated in FIG. 2C), and this missing material must be replaced. For this purpose, the following step (block 134 of FIG. 16) is a selective re-oxidation step which restores oxide material removed from the insulator layer 40. The re-oxidation step must be selective in order to avoid re-oxidizing the sidewalls of the tungsten gate layer 48c The re-oxidation step 134 consists of the following sub-steps:

(a) introducing into a vacuum chamber in which the substrate resides a second process gas that includes oxygen and a reducing agent such as hydrogen while maintaining a vacuum pressure in the chamber (block 134-1 of FIG. 16);

(b) forming oxide on the insulating layer by generating a plasma in a plasma generation region within the vacuum chamber (block 134-2);

(c) maintaining a separation between the ion generation region and the substrate of a distance $L_D$ (block 134-3);

(d) applying plasma source power only during successive "on" times, allowing ion energy of the plasma to decay during successive "off" intervals separating the successive "on" intervals, the "on" and "off" intervals defining a second controllable duty cycle (block 134-4);

(e) limiting the duty cycle so as to limit formation of ion bombardment-induced defects in the insulating layer (block 134-5) to a defect density less than about $5\times10^{10}$ $cm^{-2}.eV^{-1}$; and (f) limiting the vacuum pressure so as to limit formation of contamination-induced defects in the insulating layer (block 134-5).

The foregoing gate re-oxidation process may be applied to a gate electrode not having tungsten material, such as a gate that consists only of polysilicon. In such a case, the use of hydrogen gas may not be needed.

In some cases, the gate oxide 40 formed by the pulsed RF plasma process described above is implanted with a species such as nitrogen to enhance its performance, or to reduce current leakage or change the dielectric constant, for example. In such a case, the defect density is increased slightly. For example, if the gate oxide is deposited with a defect density of about $5 \times 10^{10}$ cm$^{-2}$.eV$^{-1}$, then following the introduction (or implantation) of nitrogen, the defect density may become $10^{11}$ cm$^{-2}$.eV$^{-1}$ but this is still a great improvement considering the very low temperature at which the oxide was deposited.

While the invention has been described in detail by specific reference to preferred embodiments, it is understood that variations and modifications thereof may be made without departing from the true spirit and scope of the invention.

What is claimed is:

1. A method of fabricating a gate of a transistor device on a semiconductor substrate, comprising:
    placing said substrate in a vacuum chamber of a plasma reactor;
    introducing into said chamber a process gas that includes oxygen;
    forming an oxide insulating layer at the surface of said substrate by generating a plasma in a plasma generation region within said vacuum chamber during successive "on" times, and allowing ion energy of said plasma to decay during successive "off" intervals separating the successive "on" intervals, said "on" and "off" intervals defining a controllable duty cycle; and
    during the step of forming the oxide insulating layer, limiting said duty cycle so as to limit formation of defects in said insulating layer;
    wherein said plasma is separated from said substrate by a distance L, and wherein ions in said plasma travel from said ion generation region to said substrate at an average drift velocity, and said distance L is at least as great as the product of said drift velocity and said "off" time.

2. The method of claim 1 further comprising:
    during the step of forming the oxide, limiting the pressure in said chamber so as to limit formation of contamination-induced defects in said insulating layer; and
    depositing a conductive gate electrode over said insulating layer.

3. The method of claim 2 wherein the step of limiting said vacuum pressure comprises limiting said pressure to about 20 mT or less.

4. The method of claim 1 wherein the step of limiting said duty cycle comprises limiting said duty cycle to about 20% or less.

5. The method of claim 1 wherein the step of limiting said duty cycle comprises limiting said duty cycle sufficiently to limit kinetic ion energy at the surface of said substrate below a selected threshold energy.

6. The method of claim 5 wherein said threshold energy is at or below about 5 eV.

7. The method of claim 1 wherein the step of forming an oxide of said semiconductor substrate comprises oxidizing the semiconductor material of said substrate in said plasma.

8. The method of claim 1 wherein said process gas contains oxygen and the species of said semiconductor substrate, and wherein the step of forming an oxide of said semiconductor substrate comprises form said oxide from said process gas while depositing said oxide on said substrate.

9. The method of claim 1 further comprising maintaining said substrate below a selected temperature.

10. The method of claim 9 wherein said selected temperature is below about 800 degrees C.

11. The method of claim 9 wherein said selected temperature is below about 700 degrees C.

12. The method of claim 1 further comprising:
    first etching said conductive gate layer to form a discrete electrode layered structure, so as to form side walls of the layered structure;
    second etching said layered structure to remove oxidation from side walls of the conductive layer of said layered structures;
    performing a reoxidation step to restore oxide material removed from side walls of an insulator layer of said layered structures during the second etching step, said re-oxidation step comprising:
        (a) introducing into a vacuum chamber in which said substrate resides a second process gas that includes oxygen while maintaining a second vacuum pressure in the chamber;
        (b) forming oxide insulating material on the insulating layers of said layered structures by generating a plasma in a plasma generation region within said vacuum chamber during successive "on" times, and allowing ion energy of said plasma to decay during successive "off" intervals separating the successive "on" intervals, said "on" and "off" intervals defining a second controllable duty cycle;
        (c) limiting said second duty cycle so as to limit formation of ion bombardment-induced defects in said insulating side layers.

13. The method of claim 12 further comprising:
    limiting said second vacuum pressure so as to limit formation of contamination-induced defects in said insulating side layers.

14. The method of claim 13 wherein said second process gas comprises oxygen and a reducing agent that prevents formation of an oxide on the side walls of the conductive layers of said layered structure during the re-oxidation step.

15. The method of claim 13 wherein the step of depositing the conductive gate electrode comprises depositing a tungsten gate layer, and said reducing agent is hydrogen.

16. The method of claim 15 wherein said second process gas comprises about 90% hydrogen and 10% oxygen.

17. A method of fabricating a gate of a transistor device on a semiconductor substrate, comprising:
    placing said substrate in a vacuum chamber of a plasma reactor;
    introducing into said chamber a process gas that includes oxygen;
    forming an oxide insulating layer at the surface of said substrate by generating a plasma in a plasma generation region within said vacuum chamber during successive "on" times, and allowing ion energy of said plasma to decay during successive "off" intervals separating the successive "on" intervals, said "on" and "off" intervals defining a controllable duty cycle; and
    during the step of forming the oxide insulating layer, limiting said duty cycle so as to limit formation of defects in said insulating layer;

wherein the step of limiting said duty cycle comprises limiting said duty cycle sufficiently to limit defect density in said oxide layer at or below about $5 \times 10^{10}$ cm$^{-2}$. eV$^{-1}$.

18. A method of fabricating a gate of a transistor device on a semiconductor substrate, comprising:

placing said substrate in a vacuum chamber of a plasma reactor;

introducing into said chamber a process gas that includes oxygen;

forming an oxide insulating layer at the surface of said substrate by generating a plasma in a plasma generation region within said vacuum chamber during successive "on" times and allowing ion energy of said plasma to decay during successive "off" intervals separating the successive "on" intervals, said "on" and "off" intervals defining a controllable duty cycle; and during the step of forming the oxide insulating layer, limiting said duty cycle so as to limit formation of defects in said insulating layer;

wherein the step of limiting said duty cycle comprises limiting said duty cycle sufficiently to limit defect density in said oxide layer at or below about $10^{11}$ cm$^{-2}$. eV$^{-1}$.

19. A method of fabricating a gate of a transistor device on a semiconductor substrate, comprising:

placing said substrate in a vacuum chamber of a plasma reactor;

introducing into said chamber a process gas that includes oxygen;

forming an oxide insulating layer at the surface of said substrate by generating a plasma in a plasma generation region within said vacuum chamber during successive "on" times, and allowing ion energy of said plasma to decay during successive "off" intervals separating the successive "on" intervals, said "on" and "off" intervals defining a controllable duty cycle; and during the step of forming the oxide insulating layer, limiting said duty cycle so as to limit formation of defects in said insulating layer;

during the step of forming the oxide, limiting the pressure in said chamber so as to limit formation of contaminationinduced defects in said insulating layer; and depositing a conductive gate electrode over said insulating layer;

wherein the step of limiting said vacuum pressure comprises reducing said vacuum pressure until contaminationinduced defects in said insulating layer are below a threshold density, while the step of limiting said duty cycle is carried out sufficiently to prevent an increase in plasma ion energy associated with the reduction in vacuum pressure.

* * * * *